(12) United States Patent
Ayai et al.

(10) Patent No.: US 6,555,504 B1
(45) Date of Patent: Apr. 29, 2003

(54) OXIDE SUPERCONDUCTING WIRE HAVING INSULATING COAT AND PRODUCTION METHOD THEREOF

(75) Inventors: Naoki Ayai, Osaka (JP); Nobuhiro Saga, Osaka (JP); Kazuhiko Hayashi, Osaka (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 09/673,256

(22) PCT Filed: Feb. 18, 2000

(86) PCT No.: PCT/JP00/00952
§ 371 (c)(1),
(2), (4) Date: Oct. 25, 2000

(87) PCT Pub. No.: WO00/52781
PCT Pub. Date: Sep. 8, 2000

(30) Foreign Application Priority Data

Feb. 26, 1999 (JP) ............................................. 11-050125
Jan. 28, 2000 (JP) ......................................... 2000-19713

(51) Int. Cl.[7] ................................................ H01L 39/24
(52) U.S. Cl. ..................................... 505/434; 505/470
(58) Field of Search ................................ 428/701, 697, 428/930, 469, 548, 551, 552, 553, 554, 555, 617, 621, 632; 505/230, 231, 233, 236, 237, 430, 433, 434, 470, 472, 704, 740

(56) References Cited

U.S. PATENT DOCUMENTS

| | | | | |
|---|---|---|---|---|
| 3,951,870 A | * | 4/1976 | Economy et al. | 252/506 |
| 4,611,390 A | * | 9/1986 | Tanaka et al. | 29/599 |
| 5,075,285 A | * | 12/1991 | Flukiger | 29/59 |
| 5,296,456 A | * | 3/1994 | Shiga et al. | 428/632 |
| 5,379,020 A | * | 1/1995 | Meier et al. | 174/125.1 |
| 5,506,198 A | * | 4/1996 | Sato | 428/688 |
| 5,516,753 A | * | 5/1996 | Ohkura et al. | 174/125.1 |
| 5,814,583 A | * | 9/1998 | Itozaki et al. | 428/700 |
| 5,874,384 A | * | 2/1999 | Balachandran et al. | 174/125.1 |
| 5,929,000 A | * | 7/1999 | Hahakura et al. | 174/125.1 |
| 5,932,523 A | * | 8/1999 | Fujikami et al. | 174/125.1 |
| 6,121,630 A | * | 9/2000 | Itozaki et al. | 257/32 |
| 6,192,573 B1 | * | 2/2001 | Hahakura et al. | 174/125.1 |
| 6,194,985 B1 | * | 2/2001 | Tanaka et al. | 174/125.1 |
| 6,295,354 B1 | * | 7/2001 | Wu | 505/430 |
| 6,305,069 B1 | * | 10/2001 | Fujikami et al. | 29/599 |
| 6,313,408 B1 | * | 11/2001 | Fujikami et al. | 174/125.1 |
| 6,349,226 B1 | * | 2/2002 | Yoshino et al. | 174/125.1 |

FOREIGN PATENT DOCUMENTS

| | | | |
|---|---|---|---|
| EP | 0769819 A1 | * | 4/1997 |
| JP | 06291489 A | * | 10/1994 |
| JP | 10125147 A | * | 5/1998 |

OTHER PUBLICATIONS

Y. Hikichi et al., "Superconducting Properties of $(Bi, Pb)_2Sr_2Ca_2Cu_3O_x$ Multifilament Wires of Fabricatin of a Coil", vol. 2, pp. 917–920, Superconductor Research & Development Dept., Showa Electric Wire & Cable Co., Ltd., Japan, Springer–Verlag Tokyo, (1998).

* cited by examiner

*Primary Examiner*—Tom Dunn
*Assistant Examiner*—Colleen P. Cooke
(74) *Attorney, Agent, or Firm*—Foley & Lardner

(57) ABSTRACT

An oxide superconducting wire includes oxide superconducting filaments 1, a matrix 2, a covering layer 3, and an insulating layer 4. The matrix 2 is placed so as to enclose the oxide superconducting filaments 1 and is made of silver. The covering layer 3 is placed so as to enclose the matrix 2, contains silver and manganese, and has a thickness of 10 $\mu$m to 50 $\mu$m. The insulating layer 4 is placed so as to enclose the covering layer 3.

23 Claims, 7 Drawing Sheets

OXIDE SUPERCONDUCTING WIRE HAVING INSULATING COAT AND PRODUCTION METHOD THEREOF

TECHNICAL FIELD

The present invention relates to an oxide superconducting wire and a production method therefor, and more particularly, relates to an oxide superconducting wire having an insulating layer and a production method therefor.

BACKGROUND ART

Conventionally, a bismuth-based oxide superconducting wire is known as one type of oxide superconducting wire. The bismuth-based oxide superconducting wire can be used at a liquid nitrogen temperature and can yield a relatively high critical current density. Moreover, since the bismuth-based oxide superconducting wire can be relatively easily elongated, applications thereof to superconducting cables and magnets are expected.

When such an oxide superconducting wire is applied to a magnet, it is required to have an insulating layer, from the viewpoint of coiling efficiency and the like.

The above-described bismuth-based oxide superconducting wire is used as a tape-shaped wire in many cases for the following reasons. That is, the critical current density of an oxide superconductor exhibits considerably high anisotropy, and therefore, it is necessary to align polycrystals of the oxide superconductor in order to achieve a high critical current density.

The bismuth-based oxide superconducting wire is deformed into a tape by plastic deformation such as rolling. The polycrystals of precursor of the oxide superconductor are aligned by the plastic deformation.

The width of the tape-shaped oxide superconducting wire varies within the range of ±0.2 mm in the above-described plastic deformation process. It is therefore necessary to adopt a method for reliably forming an insulating layer over the entire surface of the tape-shaped wire even when the width of the wire varies. As a result, it has been considered to adopt a method of forming an insulating layer in the above tape-shaped wire in which an insulating-film base is applied to a tape-shaped wire by putting the tape-shaped wire between felts impregnated with the insulating-film base and the tape-shaped wire is then subjected to baking. The tape-shaped wire in such an insulating layer forming method using felts is coated solely with a layer of the insulating-film base of approximately 1.5 $\mu$m in thickness in one operation of applying the insulating-film base. For this reason, in such an insulating layer forming method using the felts, an operation of applying the insulating-film base and a baking operation are usually repeated about ten times.

However, when the above insulating layer forming method is applied to a tape-shaped bismuth-based oxide superconducting wire, the critical current density of the tape-shaped oxide superconducting wire decreases substantially after an insulating layer is formed. This is due to the following reasons.

When the above insulating layer forming method is applied to a tape-shaped oxide superconducting wire, the tape-shaped wire is heated at a high temperature in the baking process. The temperature of the tape-shaped wire is raised by the high-temperature heating. The tape-shaped wire is composed of oxide superconducting filaments and a metal covering layer formed around the oxide superconducting filaments. With the above-described increase in temperature of the tape-shaped wire, the metal covering layer and the oxide superconducting filaments in the tape-shaped wire are thermally expanded. In this case, strain occurs in the tape-shaped wire due to a difference in coefficient of thermal expansion between the metal covering layer and the oxide superconducting filaments. For this reason, a mechanical strain is exerted on the oxide superconducting filaments. As a result, superconducting properties are deteriorated, for example, the critical current density of the tape-shaped oxide superconducting wire is lowered.

When the insulating-film base applying and the baking are repeated about ten times, it is necessary to put the tape-shaped wire into a baking furnace a predetermined number of times. In this case, since the tape-shaped wire is led into the baking furnace a plurality of times, the direction of travel of the tape-shaped wire occasionally changes by using a roller, although this depends on the configuration of an apparatus for applying and baking the insulating-film base. Since the tape-shaped wire is bent along the roller, it is subjected to bending.

In order to move the tape-shaped wire in the felts and the baking furnace, it is necessary to constantly apply a fixed tension to the tape-shaped wire. Such bending of the tape-shaped wire and application of tension thereto also put excessive mechanical strain on the oxide superconducting filaments. As a result, the superconducting properties of the tape-shaped oxide superconducting wire are deteriorated, and the critical current density is lowered.

As described above, it is difficult to form an insulating layer in the conventional tape-shaped oxide superconducting wire without deteriorating the superconducting properties.

The present invention has been developed to solve the above problems, and an object of the invention is to provide an oxide superconducting wire which allows an insulating layer to be formed without deteriorating the superconducting properties, and to provide a production method therefor.

DISCLOSURE OF INVENTION

According to a first aspect of the present invention, an oxide superconducting wire includes an oxide superconducting filament, a matrix, a covering layer, and an insulating layer. The matrix is made of silver and is placed so as to enclose the oxide superconducting filament. The covering layer, placed so as to enclose the matrix, contains silver and manganese, and has a thickness of 10 $\mu$m to 50 $\mu$m. The insulating layer is placed so as to enclose the covering layer.

Since the covering layer is made of a material containing silver and manganese, the mechanical strength thereof can be increased. This ensures sufficient strength to withstand the tension and bending applied to the oxide superconducting wire when forming the insulating layer. That is, since the covering layer of the oxide superconducting wire thus has sufficient strength, it is possible to prevent the exertion of excessive mechanical strain on the oxide superconducting filament in the process of forming the insulating layer, the process of constructing a magnet, a cable, or the like by using the oxide superconducting wire, and in the case in which stress is applied to the oxide superconducting wire by a temperature change due to cooling and electromagnetic force when operating an equipment using the oxide superconducting wire, such as a magnet. As a result, it is possible to prevent deterioration of the superconducting properties of the oxide superconducting filament. For this reason, the critical current density of the oxide superconducting wire is prevented from being lowered.

While manganese is used as an element to be contained in the covering layer in order to increase the strength thereof, it has a relatively low reactivity with an oxide superconductor. For this reason, it is possible to inhibit the problem that the element in the covering layer in a sintering process for generating the oxide superconductor hinders the generative reaction of an oxide superconductor. Since the matrix of silver is interposed between the oxide superconducting filament and the covering layer, manganese in the covering layer can be reduced by the matrix from diffusing to the oxide superconducting filament. This more reliably reduces the above problem in which the generative reaction of the oxide superconductor is hindered by manganese in the covering layer.

Since the thickness of the covering layer is within the range of 10 $\mu$m to 50 $\mu$m, the covering layer can be formed without causing fatal defects, such as cracks, in the production procedure for the oxide superconducting wire. Moreover, the oxide superconductor can be generated reliably because gas generated with the generative reaction of the oxide superconductor can be reliably released from the wire. In the case in which the thickness of the covering layer is less than 10 $\mu$m, defects, such as cracks, arise in the covering layer in a step of shaping the oxide superconducting wire in the production procedure therefor. In the case in which the thickness of the covering layer is more than 50 $\mu$m, gas generated with the generative reaction of the oxide superconductor is not properly released from the wire, which results in an incomplete generative reaction of the oxide superconductor. Alternatively, a phenomenon sometimes occurs in which a cavity is formed in the wire due to the gas. In this case, the superconducting properties of the oxide superconducting wire are markedly deteriorated. Furthermore, in the case in which the thickness of the covering layer is more than 50 $\mu$m, the ratio of the occupied area of the oxide superconducting filament to the total cross-sectional area of the oxide superconducting wire decreases, and therefore, the current density of the oxide superconducting wire is lowered.

In the case in which the oxide superconducting wire of the present invention is applied to equipment, such as a magnet, superior coiling efficiency can be obtained because of the insulating layer of the oxide superconducting wire. This makes it possible to improve the packing rate and the dimensional accuracy of the oxide superconducting wire and to easily obtain a high insulating property, which differs from the conventional coiling operation in which insulating materials are put between the portions of the superconducting wire.

Since the insulating layer is formed beforehand, when the oxide superconducting wire is exposed to a cryogen, such as liquid nitrogen or liquid helium, the insulating layer can be used as a protective film for preventing the cryogen from entering the interior of the covering layer or the matrix. In the case in which an oxide superconducting wire having no insulating layer is applied to a magnet, a cable, and the like, it is necessary to insulate portions of the oxide superconducting wire by some means. For example, a means is considered in which a coiling operation is performed while putting an insulating material between the portions of the oxide superconducting wire. In the case in which a cryogen is used to cool an equipment thus produced, such as a magnet, it sometimes directly contacts a portion of the surface of an oxide superconducting wire constituting the device, where an insulating layer is not formed. If the surface of the oxide superconducting wire has a defect, such as a pinhole, the cryogen enters the interior of the oxide superconducting wire. When the temperature of the oxide superconducting wire rises above the boiling point of the cryogen in this state, the cryogen is vaporized inside the wire. The vaporized cryogen forms a cavity inside the wire. When such a cavity is formed, the superconducting properties of the oxide superconducting wire having no insulating layer are markedly deteriorated. Since the oxide superconducting wire of the present invention has the insulating layer, however, the above problem is avoided.

It is preferable that the covering layer in the oxide superconducting wire according to the above first aspect contain 0.1% to 0.5% manganese by weight.

This makes it possible to reliably increase the strength of the covering layer and to prevent manganese from hindering a generative reaction of the oxide superconductor. When the manganese content is less than 0.1% by weight, the strength of the covering layer cannot be sufficiently increased. When the manganese content is in excess of 0.5% by weight, in the oxide superconducting wire using the silver matrix according to the first aspect, the manganese in the covering layer diffuses and reaches the interior of the matrix. As a result, a generative reaction of the oxide superconductor is hindered by manganese.

According to another aspect of the present invention, an oxide superconducting wire includes an oxide superconducting filament, a matrix, a covering layer, and an insulating layer. The matrix contains silver and antimony and is placed so as to enclose the oxide superconducting filament. The covering layer is placed so as to enclose the matrix, contains silver and manganese, and has a thickness of 10 $\mu$m to 50 $\mu$m. The insulating layer is placed so as to enclose the covering layer.

Since a material containing silver and manganese is used as the covering layer, in a manner similar to that of the oxide superconducting wire according to the above first aspect of the present invention, the mechanical strength of the covering layer can be increased. This makes it possible to ensure strength of the covering layer that sufficiently withstands tension and bending to be applied to the oxide superconducting wire when forming the insulating layer. That is, it is possible to prevent the exertion of excessive mechanical strain on the oxide superconducting filament in the process of forming the insulating layer or the like. As a result, it is possible to prevent the deterioration of the superconducting properties of the oxide superconducting filament. Consequently, this prevents the decrease of the critical current density of the oxide superconducting wire.

While manganese is used as an element to be contained in the covering layer in order to increase strength, it has a relatively low reactivity with an oxide superconductor. For this reason, it is possible to inhibit the problem that the element in the covering layer in a sintering process for generating the oxide superconductor hinders the generative reaction of an oxide superconductor. Since the matrix containing silver and antimony is interposed between the oxide superconducting filament and the covering layer, manganese in the covering layer can be restricted from diffusing to the oxide superconducting filament by the matrix. As a result, it is possible to more reliably avoid the above problem, that is, the hindrance of the generative reaction of the oxide superconductor by manganese in the covering layer.

The matrix contains antimony. Antimony serves to restrict manganese in the covering layer from diffusing to a region where the superconducting filament is placed. For this reason, the manganese content of the covering layer can be made higher than that in the case in which only silver is used as the matrix, without deteriorating the superconducting properties of the oxide superconducting wire. This further increases the mechanical strength of the covering layer.

Since the thickness of the covering layer is 10 $\mu$m to 50 $\mu$m, it is possible to form the covering layer in a production procedure, which will be described later, without causing fatal defects such as cracks, in a manner similar to that of the oxide superconducting wire according to the above first aspect. Moreover, it is possible to reliably release gas, which is generated with the generative reaction of the oxide superconductor, from the wire. For this reason, the oxide superconductor can be formed reliably. When the thickness of the covering layer is less than 10 $\mu$m, defects, such as cracks, occur in the covering layer in the wire shaping process of the production procedure for the oxide superconducting wire. When the thickness of the covering layer is more than 50 $\mu$m, gas, which is generated with the generative reaction of the oxide superconductor, is not sufficiently released from the wire, and this results in an incomplete generative reaction of the oxide superconductor. Inside the wire, a cavity is sometimes formed due to the above-described gas. This markedly deteriorates the superconducting properties of the oxide superconducting wire. When the thickness of the covering layer is more than 50 $\mu$m, the ratio of the occupied area of the oxide superconducting filament to the total cross-sectional area of the oxide superconducting wire is decreased, and therefore, the current density of the oxide superconducting wire is markedly lowered.

Since the oxide superconducting wire includes the insulating layer, in the case in which the oxide superconducting wire of the present invention is applied to equipment, such as a magnet, superior coiling efficiency can be obtained. In contrast to the conventional case in which insulating materials are put between the portions of the superconducting wire during a coiling operation, it is also possible to improve the packing rate and the dimensional accuracy of the oxide superconducting wire and to easily obtain a high insulating property.

Since the insulating layer is formed beforehand, when the oxide superconducting wire is exposed to a cryogen, such as liquid nitrogen or liquid helium, the insulating layer can be used as a protective film for preventing the cryogen from entering the interior of the covering layer or the matrix.

In the above-described oxide superconducting wire according to another aspect, it is preferable that the matrix contain 0.1% to 0.5% antimony by weight, and that the covering layer contain 0.5% to 1.0% manganese by weight.

In this case, the mechanical strength of the covering layer can be sufficiently increased by manganese, and manganese in the covering layer can be more reliably prevented from diffusing into the matrix by antimony. That is, since the diffusion of manganese can be inhibited by antimony, the manganese content of the covering layer can be made higher than that in the above-described oxide superconducting wire according to the first aspect. This can increase the mechanical strength of the covering layer.

When the antimony content of the matrix exceeds 0.5% by weight, the superconducting properties of the oxide superconducting filament are deteriorated. For this reason, the critical current density of the oxide superconducting wire is lowered. When the antimony content of the matrix is less than 0.1% by weight, it is impossible to sufficiently obtain the antimony's effect of preventing the diffusion of manganese.

When the manganese content of the covering layer is more than 0.5% by weight, it is possible to obtain sufficient strength of the covering layer which is greater than that in the oxide superconducting wire according to the first aspect of the present invention. In contrast, when the manganese content exceeds 1.0% by weight, manganese sometimes diffuses and reaches a region where the oxide superconducting filament is placed. In this case, a generative reaction of an oxide superconductor is hindered by manganese in the production procedure for the oxide superconducting wire.

In the oxide superconducting wire according to the first aspect or another aspect, it is preferable that manganese be dispersed as oxide particles in the covering layer (claim 5).

In this case, since the oxide particles of manganese are dispersed in the covering layer, they can reliably increase the mechanical strength of the covering layer.

In the oxide superconducting wire according to the first aspect or another aspect, it is preferable that manganese exists while being in a solid solution in the covering layer.

In this case, lattice strain is formed in a material other than manganese (e.g., silver), which constitutes the covering layer, due to manganese being in a solid solution in the material. This can increase the mechanical strength of the covering layer.

In the oxide superconducting wire according to the first aspect or another aspect, it is preferable that the thickness of the covering layer be within the range of 20 $\mu$m to 40 $\mu$m.

In this case, it is possible to reliably achieve a high critical current density of the oxide superconducting wire and to reliably release gas, which results from a generative reaction of the oxide superconductor, from the wire. For this reason, it is possible to obtain an oxide superconducting wire having superior superconducting properties.

According to the first aspect or another aspect of the oxide superconducting wire, it is preferable that the oxide superconducting wire be shaped like a tape having a flat portion.

This allows a coiling operation to be easily performed when the oxide superconducting wire of the present invention is applied to a magnet or the like.

When forming an insulating layer in the tape-shaped oxide superconducting wire, a method is adopted to form an insulating layer by using felt. In the case in which the operation of applying a base to become an insulating layer and a baking operation are repeated a plurality of times, as in such insulating layer forming method by using a felt, the superconducting properties can be reliably prevented from being deteriorated in the oxide superconducting wire of the present invention. For this reason, the above-described advantages of the present invention are prominent, in particular, in the tape-shaped oxide superconducting wire.

According to the first aspect or another aspect of the oxide superconducting wire, it is preferable that the thickness of the covering layer at the flat portion be within the range of 10 $\mu$m to 50 $\mu$m.

In this case, since the flat portion constitutes a large proportion of the surface of the tape-shaped oxide superconducting wire, when the thickness of the covering layer at the flat portion is within the range of 10 $\mu$m to 50 $\mu$m, as described above, the above-described advantages of the oxide superconducting wire of the present invention can be provided more reliably.

It is preferable that in the oxide superconducting wire according to the first aspect or another aspect the thickness of the covering layer at the flat portion be within the range of 20 $\mu$m to 40 $\mu$m.

In this case, it is possible to reliably achieve a high critical current density in the oxide superconducting wire, as described above, and to reliably release gas, which is generated due to a generative reaction of an oxide superconductor, from the wire. This makes it possible to more reliably obtain an oxide superconducting wire having superior superconducting properties.

It is preferable that in the oxide superconducting wire according to the first aspect or another aspect the thickness of the insulating layer be within the range of 5 $\mu$m to 100 $\mu$m.

When the thickness of the insulating layer is less than 5 $\mu$m, a local dielectric breakdown is prone to occur, and defects, such as pinholes, are prone to occur in the insulating layer. When equipment using the oxide superconducting wire is operating, the oxide superconducting wire is cooled by a cryogen such as liquid nitrogen. In this case, the cryogen sometimes enters the interior of the insulating layer from the defects. If the temperature of the oxide superconducting wire rises above the boiling point of the cryogen in this state, the cryogen vaporizes. For this reason, the insulating layer is broken by the vaporized cryogen, or a cavity is formed inside the oxide superconducting wire and the oxide superconducting wire becomes a partially bulged shape. In this case, the superconducting properties of the oxide superconducting wire are substantially deteriorated. When the thickness of the insulating layer exceeds 100 $\mu$m, the ratio of the occupied area of the superconducting filament to the cross-sectional area of the oxide superconducting wire decreases, and therefore, the critical density decreases. When the thickness of the insulating layer is within the above range, the above problems can be avoided.

It is preferable that in the oxide superconducting wire according to the first aspect or another aspect the insulating layer contains resin.

In this case, since resin can be baked in a temperature range that does not deteriorate the properties of the oxide superconducting wire, an insulating layer can be formed without deteriorating the superconducting properties of the oxide superconducting filament. The use of resin also permits an insulating layer with a relatively small thickness having no defects such as pinholes. As a result, it is possible to achieve a high current density and to effectively prevent the penetration of the cryogen into the interior of the oxide superconducting wire. By selecting an appropriate resin, it is possible to achieve an insulating layer having sufficient insulating properties, water resistance, stability with respect to temperature change, and heat resistance.

It is preferable that in the oxide superconducting wire according to the first aspect or another aspect the resin be a formal resin.

A formal resin can be baked at a baking temperature of 400° C. or less which is relatively lower than that for other resins. Therefore, the baking temperature in a process for forming the insulating layer can be made lower than that in cases where other resins are used. This decreases the temperature for heating the oxide superconducting wire in the process for forming the insulating layer. For this reason, it is possible to reduce mechanical strain due to the heat in the oxide superconducting filament. As a result, it is possible to reliably prevent the deterioration of the superconducting properties of the oxide superconducting wire.

It is preferable that in the oxide superconducting wire according to the first aspect or another aspect the oxide superconducting filament be a bismuth-based oxide superconducting filament.

A bismuth-based oxide superconductor can be used at liquid nitrogen temperature. Since the bismuth-based oxide superconductor can yield a relatively high critical current density and can be elongated, the application thereof to a magnet or the like is expected. In the application to a magnet or the like, an oxide superconducting wire having an insulating layer is required from the viewpoint of coiling efficiency and the like. For this reason, the application of the present invention to the bismuth-based oxide superconducting wire provides particularly noticeable advantages.

An oxide superconducting wire production method according to a further aspect of the present invention includes a step of preparing a wire having powder of precursor to be sintered into an oxide superconductor, a matrix made of silver and placed so as to enclose the powder of precursor, and a covering layer containing silver and 0.1% to 0.5% manganese by weight placed so as to enclose the matrix; a sintering step of forming an oxide superconductor from the powder of precursor by heating the wire; and a coating step for forming an insulating layer on the outer surface of the covering layer so as to enclose the covering layer in a state in which tension is applied to the wire having the oxide superconductor in the longitudinal direction.

Since the covering layer thus contains silver and 0.1% to 0.5% manganese by weight, it is possible to obtain a wire having adequate strength to sufficiently withstand tension and bending to be applied to the wire in the covering step of forming the insulating layer. That is, since the covering layer of the oxide superconducting wire thus has sufficient strength, it is possible to prevent the exertion of excess mechanical strain onto the oxide superconductor in the coating step of forming the insulating layer. As a result, it is possible to prevent the decrease of the critical current density of the oxide superconducting wire due to excessive mechanical strain.

When the manganese content is less than 0.1% by weight, it is impossible to sufficiently increase the strength of the covering layer. When the manganese content is more than 0.5% by weight, in the wire having the matrix made of silver, the manganese in the covering layer diffuses and reaches the interior of the matrix in the sintering step. As a result, the generative reaction of the oxide superconductor in the sintering step is hindered by manganese.

An oxide superconducting wire production method according to a still further aspect of the present invention includes a step of preparing a wire having powder of precursor to be sintered into an oxide superconductor, a matrix containing silver and 0.1% to 0.5% antimony by weight placed so as to enclose the powder of precursor, and a covering layer containing silver and 0.5% to 1.0% manganese by weight placed so as to enclose the matrix; a sintering step of forming an oxide superconductor from the powder of precursor by heating the wire; and a coating step of forming an insulating layer on the outer surface of the covering layer so as to enclose the covering layer in a state in which tension is applied to the wire having the oxide superconductor in the longitudinal direction.

Since a material containing silver and 0.5% to 1.0% manganese by weight is used as the covering layer, the mechanical strength of the covering layer can be further increased, compared with that in the oxide superconducting wire production method according to the above further aspect. This makes it possible to ensure strength of the covering layer that sufficiently withstands tension and bending to be applied to the wire in the coating step. That is, it is possible to prevent the exertion of excessive mechanical strain on the oxide superconductor in the coating step of forming the insulating layer. As a result, it is possible to prevent the decrease of the critical current density of the oxide superconducting wire.

Manganese in the covering layer can be reliably prevented by antimony in the matrix from diffusing into the matrix.

When the antimony content of the matrix exceeds 0.5% by weight, the superconducting properties of the oxide superconducting filament are deteriorated. When the antimony content of the matrix is less than 0.1% by weight, it is impossible to sufficiently obtain the effect of the antimony described above which prevents the diffusion of manganese.

When the manganese content of the covering layer is 0.5% or more by weight, it is possible to obtain a sufficient mechanical strength of the covering layer which is higher than that of the covering layer according to the above further aspect. In contrast, when the manganese content exceeds 1.0% by weight, manganese sometimes diffuses and reaches the region of the oxide superconductor. In this case, a generative reaction of the oxide superconductor is hindered by manganese in the sintering step.

In the oxide superconducting wire production method according to the further or still further aspect, it is preferable that the preparation step include a step of filling a first pipelike member to become the matrix with powder of precursor, a step of drawing the first pipelike member filled with the powder of precursor, a step of placing the narrowed first pipelike member inside a second pipelike member to become a covering layer, and a step of drawing the second pipelike member with the narrowed first pipelike member placed therein.

In this case, the preparation step can be carried out more easily than a case in which a sheetlike member is used as a member to become a covering layer.

In the oxide superconducting wire production method according to the further or still further aspect, it is preferable that the thickness of the covering layer in the preparation step be within the range of 10 $\mu$m to 50 $\mu$m.

In this case, since gas, which is generated with a generative reaction of the oxide superconductor in the sintering process, can easily pass through the covering layer, it is reliably released from the wire. For this reason, an oxide superconductor can be generated reliably. When the thickness of the covering layer is less than 10 $\mu$m, defects, such as cracks, sometimes occur in the covering layer in the preparation step. When the thickness of the covering layer is more than 50 $\mu$m, gas generated with the generative reaction of the oxide superconductor is not properly released from the wire, which results in an incomplete generative reaction of the oxide superconductor. A cavity is sometimes formed in the wire due to the gas. In this case, the superconducting properties of the produced oxide superconducting wire are markedly deteriorated.

In the oxide superconducting wire production method according to the further or still further aspect, it is preferable that the thickness of the covering layer in the preparation step be within the range of 20 $\mu$m to 40 $\mu$m.

In this case, it is possible to prevent defects from occurring in the covering layer and to reliably release gas, which is generated due to a generative reaction of an oxide superconductor in the sintering step, from the wire.

In the oxide superconducting wire production method according to the further or still further aspect, it is preferable that the wire be shaped like a tape having a flat portion in the preparation step.

In this case, since the surface area of the covering layer is made larger than that of a wire with a circular cross section, it is possible to more reliably release gas, which is generated due to a generative reaction of an oxide superconductor in the sintering step, from the wire via the covering layer.

In the oxide superconducting wire production method according to the further or still further aspect, it is preferable that the thickness of the covering layer at the flat portion be within the range of 10 $\mu$m to 50 $\mu$m.

In this case, since the flat portion constitutes a large proportion of the surface of the oxide superconducting wire, when the thickness of the covering layer at the flat portion is within the range of 10 $\mu$m to 50 $\mu$m, as described above, it is possible to more reliably release gas, which is generated due to a generative reaction of an oxide superconductor in the sintering step, from the wire. This reliably yields an oxide superconducting wire having superior superconducting properties.

In the oxide superconducting wire production method according to the further or still further aspect, it is preferable that the thickness of the covering layer at the flat portion be within the range of 20 $\mu$m to 40 $\mu$m.

In this case, it is possible to reliably prevent defects from occurring in the covering layer and to reliably release gas, which is generated due to a generative reaction of an oxide superconductor in the sintering step, from the wire.

In the oxide superconducting wire production method according to the further or still further aspect, it is preferable that the thickness of the insulating layer in the coating step be within the range of 5 $\mu$m to 100 $\mu$m.

When the thickness of the insulating layer is less than 5 $\mu$m, defects, such as pinholes, are prone to occur in the insulating layer in the coating step. When the thickness of the insulating layer exceeds 100 $\mu$m, the ratio of the occupied area of the oxide superconductor to the cross-sectional area of the oxide superconducting wire decreases, and therefore, the current density decreases.

In the oxide superconducting wire production method according to the further or still further aspect, it is preferable that the insulating layer contains resin.

In this case, since resin can be baked in a temperature range that does not deteriorate the properties of the oxide superconducting wire, the coating step can be carried out without deteriorating the superconducting properties of the oxide superconducting wire.

In the oxide superconducting wire production method according to the further or still further aspect, it is more preferable that the resin be a formal resin.

A formal resin can be baked at a temperature of 400° C. or less which is relatively lower than those for other resins. Therefore, the baking temperature in the coating step can be lowered, compared with those in cases in which other resins are used.

In the oxide superconducting wire production method according to the further or still further aspect, it is preferable that the oxide superconductor be a bismuth-based oxide superconductor.

A bismuth-based oxide superconductor can be used at the liquid nitrogen temperature, can yield a relatively high critical current density, and can be elongated. Therefore, an application thereof to an equipment, such as a magnet, is expected. From the viewpoint of coiling efficiency when producing such equipment, an oxide superconducting wire having an insulating layer is required. For this reason, application of the present invention to a production method for a bismuth-based oxide superconducting wire provides particularly noticeable advantages.

An oxide superconducting wire according to a still further aspect of the present invention includes an oxide superconducting filament, a covering layer, and an insulating layer.

The covering layer is placed so as to enclose the oxide superconducting filament and includes a silver alloy containing 0.1% to less than 1.0% manganese by weight. The insulating layer is placed so as to enclose the covering layer.

Since the oxide superconducting wire has the insulating layer, superior coiling efficiency can be obtained when the oxide superconducting wire of the present invention is applied to a magnet or the like.

Since the covering layer includes a silver alloy containing 0.1% to less than 1.0% manganese by weight, it is possible to ensure a strength of the oxide superconducting wire that sufficiently withstands tension and bending to be applied to the oxide superconducting wire when forming the insulating layer. That is, since the covering layer of the oxide superconducting wire has such sufficient strength, it is possible to prevent the exertion of excessive mechanical strain on the oxide superconducting filament in the step of forming the insulating layer. As a result, it is possible to prevent the deterioration of the superconducting properties of the oxide superconducting filament. This can prevent the critical current density of the oxide superconducting wire from being lowered.

When the manganese content is 1.0% or more by weight, manganese sometimes enters the core portion of the oxide superconducting wire and reaches the oxide superconducting filament. In such a case, the critical current density of the oxide superconducting wire is lowered due to the entry of manganese. When the manganese content is 0.1% or more by weight, it is possible to reliably increase the tensile strength of the second covering layer. As a result, the tensile strength of the oxide superconducting wire can be reliably increased.

In the oxide superconducting wire according to the still further aspect, it is preferable that the manganese content of the silver alloy in the covering layer be within the range of 0.5% to less than 1.0% by weight.

In this case, it is possible to reliably increase the tensile strength of the oxide superconducting wire in a high-temperature environment. As a result, it is possible to more reliably prevent the deterioration of the superconducting properties of the oxide superconducting wire in the step of forming the insulating layer.

In the oxide superconducting wire according to the still further aspect, it is preferable that the covering layer includes a first covering layer and a second covering layer.

In the oxide superconducting wire according to the still further aspect, it is preferable that the first covering layer contains silver.

In the oxide superconducting wire according to the still further aspect, it is preferable that the first covering layer be made of a silver alloy containing antimony and that the second covering layer be placed so as to enclose the first covering layer and be made of a silver alloy containing 0.1% to less than 1.0% manganese by weight.

In this case, manganese contained in the second covering layer can be inhibited from diffusing and entering the interior of the oxide superconducting filament by the antimony contained in the first covering layer. As a result, it is possible to more reliably prevent the deterioration of the superconducting properties of the oxide superconducting wire due to the diffusion of manganese.

In the oxide superconducting wire according to the still further aspect, it is preferable that the first covering layer be made of a silver alloy containing 0.1% to less than 0.5% antimony by weight.

In this case, when the antimony content is within the above range, antimony is inhibited from diffusing to the oxide superconducting filament. Moreover, the diffusion of manganese to the oxide superconducting filament can be prevented by antimony in the first covering layer. As a result, it is possible to more reliably prevent the deterioration of the superconducting properties of the oxide superconducting wire.

When the antimony content is 0.5% or more by weight, the superconducting properties of the oxide superconducting filament are deteriorated. For this reason, the critical current density of the oxide superconducting wire is lowered.

Since the antimony content is 0.1% or more by weight, the above effect of preventing diffusion of manganese can be reliably achieved.

Since the silver alloy having the above antimony content is used as the first covering layer, it is possible to further increase the tensile strength of the oxide superconducting wire. For this reason, it is possible to more reliably prevent the exertion of excessive mechanical strain on the oxide superconducting filament in the step of forming the insulating layer in the oxide superconducting wire. This can reliably prevent the deterioration of the superconducting properties of the oxide superconducting wire.

In the oxide superconducting wire according to the still further aspect, it is preferable that the thickness of the insulating layer be within the range of 10 $\mu$m to 100 $\mu$m.

In the production procedure of the oxide superconducting wire, the oxide superconducting wire is sintered at a high temperature of 800° C. or more and in an oxidizing atmosphere. For this reason, coarsening of crystal grains, oxidation and precipitation of an additional element, and the like sometimes occur in the second covering layer. For example, a protuberance of approximately 2 $\mu$m to 10 $\mu$m is sometimes formed on the surface of the second covering layer including the silver alloy containing manganese by the above sintering process. For this reason, when the above protuberance is formed in the sintering process, the occurrence of defects, such as pinholes, can be prevented in the insulating layer by the protuberance, by setting the thickness of the insulating layer at 10 $\mu$m or more. This can reliably insulate the oxide superconducting wire.

When the thickness of the insulating layer exceeds 100 $\mu$m, the ratio of the oxide superconducting filament to the entire oxide superconducting wire decreases. This makes it difficult to obtain predetermined electric characteristics, such as the amount of current per unit sectional area, in the oxide superconducting wire.

In the oxide superconducting wire according to the still further aspect, it is preferable that the insulating layer contains a formal resin.

A formal resin can be baked at a temperature of 400° C. or less which is relatively lower than those for other resins. Therefore, the baking temperature in the step of forming the insulating layer can be made lower than those in cases in which other resins are used. This decreases the temperature for heating the oxide superconducting wire in the step of forming the insulating layer. For this reason, it is possible to reduce mechanical strain due to the heat in the oxide superconducting filament. As a result, it is possible to reliably prevent the deterioration of the superconducting properties of the oxide superconducting wire.

In the oxide superconducting wire according to the still further aspect, it is preferable that the oxide superconducting wire be shaped like a tape in outline.

In this case, it is possible to easily perform a coiling operation or the like when applying the oxide superconducting wire of the present invention to a magnet or the like.

In order to form an insulating layer in a tape-shaped oxide superconducting wire, a method is adopted to form an insulating layer by using a felt. In a case in which an operation of applying a base to produce the insulating layer and a baking operation are repeated a plurality of times, such as in the insulating layer forming method using the felt, the oxide superconducting wire of the present invention can reliably prevent the superconducting properties from deterioration. For this reason, the above advantages of the present invention are particularly noticeable in the tape-shaped oxide superconducting wire.

In the oxide superconducting wire according to the still further aspect, it is preferable that the oxide superconducting filament be a bismuth-based oxide superconducting filament.

In this case, a bismuth-based oxide superconductor can be used at the liquid nitrogen temperature. Since the bismuth-based oxide superconductor can yield a relatively high critical current density and can be elongated, an application thereof to a magnet or the like is expected. In the application to a magnet or the like, an oxide superconducting wire having an insulating layer is required from the viewpoint of coil efficiency and the like. For this reason, particularly noticeable advantages can be provided by applying the present invention to the bismuth-based oxide superconducting wire.

REFERENCE NUMERALS

Figure 1:
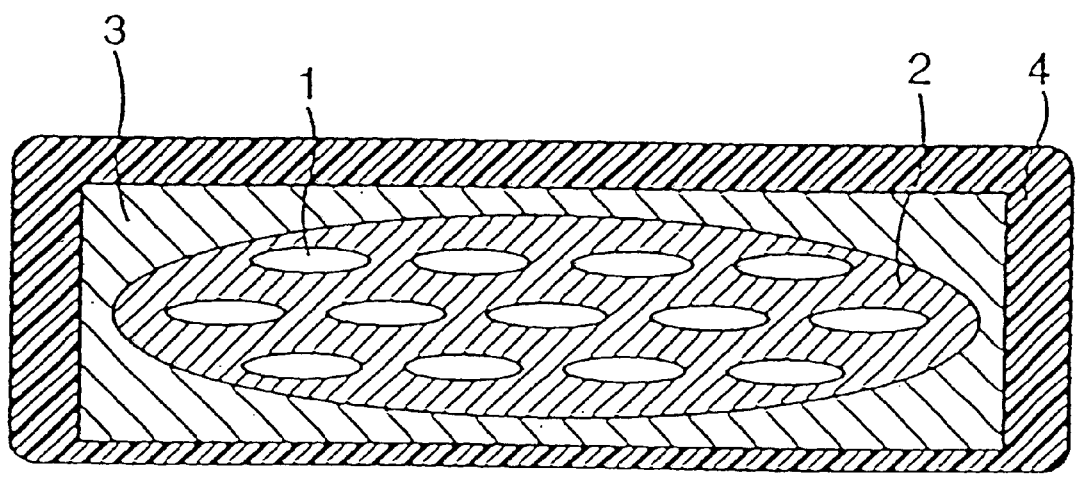
FIG. 1 is a schematic sectional view showing an oxide superconducting wire according to an embodiment of the present invention.

1: superconducting filament
2: first covering layer
3: second covering layer
4: insulating layer
5: insulating layer baking apparatus
6: baking furnace 7a, 7b: felt
8a, 8b: capstan 9: oxide superconducting wire
10: surface of second covering layer

BEST MODE FOR CARRYING OUT THE INVENTION

An embodiment of the present invention will be described below with reference to the drawings.

EMBODIMENT 1

FIG. 1 is a schematic sectional view of an oxide superconducting wire according to an embodiment of the present invention. The oxide superconducting wire will be described with reference to FIG. 1.

Referring to FIG. 1, the oxide superconducting wire comprises superconducting filaments 1 made of a bismuth-based oxide superconductor so as to serve as oxide superconducting filaments, a first covering layer 2 made of a silver alloy containing antimony (Ag—Sb alloy) so as to serve as a matrix, a second covering layer 3 made of a silver alloy containing manganese (Ag—Mn alloy) so as to serve as a covering layer, and an insulating layer 4 made of a polyvinyl formal resin. The first covering layer 2 is formed so as to enclose the superconducting filaments 1. The second covering layer 3 is formed so as to enclose the first covering layer 2. The insulating layer 4 is formed so as to enclose the second covering layer 3.

The first covering layer 2 may be made of silver, which does not contain antimony. Manganese (Mn) exists while being in a solid solution in the Ag—Mn alloy of the second covering layer 2. In this case, lattice distortion is produced in the alloy by dissolving manganese in a silver matrix constituting the second covering layer 3. This can increase the mechanical strength of the second covering layer 3. In the second covering layer 3, manganese may exist while being dispersed as oxide particles in the base material of the alloy. In this case, the oxide particles can reliably increase the mechanical strength of the second covering layer 3.

A preferable thickness of the second covering layer 3 is within the range of 10 $\mu$m to 50 $\mu$m. Since the thickness of the second covering layer 3 is thus 10 $\mu$m to 50 $\mu$m, it is possible in a production procedure, which will be described later, to form the second covering layer 3 without causing fatal defects, such as cracks, and to reliably release gas, which is generated with a reaction that forms the oxide superconducting filaments 1, from the wire.

By providing the oxide superconducting wire with the insulating layer 4, coiling efficiency can be improved when the oxide superconducting wire is applied to a magnet or the like.

Since the insulating layer 4 is formed beforehand, in the case in which the oxide superconducting wire is exposed to a cryogen, such as liquid nitrogen or liquid helium, the insulating layer 4 can be used as a protective film for preventing the cryogen from entering the interior of the second covering layer 3 or the first covering layer 2 serving as the matrix.

The second covering layer 3 has a manganese content of 0.1% to 1.0% by weight. By thus specifying the manganese content, it is possible to inhibit manganese from diffusing from the second covering layer 3 to the superconducting filaments 1 and to increase the strength of the oxide superconducting wire. As a result, in the process of forming an insulating layer in the production procedure for the oxide superconducting wire, which will be described later, it is possible to prevent the deterioration of the superconducting properties of the oxide superconducting wire when the oxide superconducting wire is subjected to tension and bending.

While manganese is used as an element to be contained in the second covering layer 3 in order to increase strength, it has a relatively low reactivity with an oxide superconductor. For this reason, in a sintering process for generating the oxide superconducting filaments 1, the reaction that forms the oxide superconductor is inhibited from hindrance by the element contained in the second covering layer 3.

When the manganese content is 0.1% or more by weight, it is possible to reliably increase the strength of the oxide superconducting wire. When the manganese content is 1.0% or less by weight, it is possible to inhibit manganese from diffusing from the second covering layer 3 to the superconducting filaments 1. As a result, it is possible to effectively prevent deterioration of the superconducting properties of the oxide superconducting wire.

In a case in which the first covering layer 2 serving as the matrix is made of silver, it is preferable that the manganese content of the second covering layer 3 be within the range of 0.1% to 0.5% by weight. This makes it possible to increase the strength of the second covering layer 3 and to reliably prevent manganese from hindering the reaction that generates the oxide superconducting filaments 1.

In a case in which the first covering layer 2 serving as the matrix contains silver and antimony, it is more preferable that the manganese content of the second covering layer 3 be within the range of 0.5% to 1.0% by weight.

This can reliably increase the tensile strength of the oxide superconducting wire in a high-temperature environment. As a result, even in a high-temperature environment, for example, during a baking operation in the process for forming the insulating layer, the oxide superconducting filaments 1 are reliably prevented from being subjected to excessive mechanical strain.

Since the first covering layer 2 is made of a silver alloy containing antimony, manganese can be more reliably inhibited from diffusing from the second covering layer 3 to the oxide superconducting filaments 1.

Preferably, the antimony content of the first covering layer 2 is set to be within the range of 0.1% to 0.5% by weight.

By setting the antimony content of the first covering layer 2 within such a range, it is possible to inhibit antimony from diffusing from the first covering layer 2 to the superconducting filaments 1, and to inhibit manganese from diffusing from the second covering layer 3 to the superconducting filaments 1. When the antimony content exceeds 0.5% by weight, the critical current density of the oxide superconducting wire decreases.

When the antimony content is 0.1% or more by weight, the above advantages can be reliably provided.

A preferable thickness of the insulating layer 4 is within the range of 5 $\mu$m to 100 $\mu$m. When the thickness of the insulating layer is less than 5 $\mu$m, local dielectric breakdown tends to occur, and defects, such as pinholes, are prone to occur in the insulating layer.

A more preferable thickness of the insulating layer 4 is within the range of 10 $\mu$m to 100 $\mu$m.

The bismuth-based oxide superconducting wire shown in FIG. 1 is subjected to sintering at a high temperature of more than 800° C. in an oxidizing atmosphere in the production procedure therefor. During sintering, phenomena, such as coarsening of crystal grains and oxidation and precipitation of the additional element, occur in the second covering layer 3 and the like. For example, protuberances of approximately 2 $\mu$m to 10 $\mu$m are sometimes formed on the surface of the Ag—Mn alloy as in the second covering layer 3. Therefore, even when the above-described protuberances are formed, the surface of the oxide superconducting wire can reliably be coated with the insulating layer 4 and thereby be insulated by setting the thickness of the insulating layer 4 at 10 $\mu$m or more.

When the thickness of the insulating layer 4 exceeds 100 $\mu$m, the ratio of the volume of the oxide superconducting filaments 1 to the total cross section of the oxide superconducting wire decreases. This makes it difficult to obtain the electric characteristics required when a magnet or the like is produced.

A polyvinyl formal resin used as the material of the insulating layer 4 can be baked at a lower temperature than those of other materials for the insulating layer. For this reason, it is possible to lower the heating temperature for baking in the process for forming the insulating layer 4, which will be described later. This reduces mechanical strain caused in the oxide superconducting wire due to heat used in the baking operation. As a result, the deterioration of the superconducting properties of the oxide superconducting wire caused by the mechanical strain can be prevented.

Since the oxide superconducting wire of the present invention is shaped like a tape, as shown in FIG. 1, it can easily be applied to a magnet or the like.

By thus applying the present invention to a bismuth-based oxide superconducting wire, which can be used at the liquid nitrogen temperature, has a relatively high critical current density, and is easily elongated, application of the oxide superconducting wire to a magnet or the like is further facilitated.

The oxide superconducting wire shown in FIG. 1 is fabricated by a silver-sheathing method. More specifically, powders of oxides or carbonates of Bi—Pb, Sr, Ca, and Cu are first mixed, sintered, and pulverized, thereby preparing powder of precursor. The powder may be made of a mixture of $Bi_2O_3$, PbO, $SrCO_3$, $CaCO_3$, and CuO so as to satisfy the conditions that the atomic ratio of Bi—Pb:Sr:Ca:Cu be equal to 2.2:2:2:3, that the composition ratio thereof be within the range of ±5%, and the ratio of Pb be within the range of 0.3 to 0.4. Subsequently, the powder of precursor is filled in a pipe made of an Ag—Sb alloy serving as a first pipelike member so as to become the first covering layer. The pipe filled with the powder of precursor is narrowed by wire drawing, thereby forming a single-core wire. A plurality of such single-core wires are bundled and inserted into a pipe made of an Ag-Mn alloy serving as a second pipe like member so as to become the second covering layer. After the Ag—Mn alloy pipe having the single-core wires therein is narrowed by wire drawing, it is rolled into a tape, thereby preparing a wire. The preparation process of the present invention is performed in this way. A tape-shaped wire permits a larger surface area of the second covering layer 3 than that of a wire of circular cross section when the wires are the same in cross-sectional area. Therefore, gas produced by a reaction that generates the oxide superconductor in the sintering process can be more reliably released from the wire via the second covering layer 3.

Figure 2:
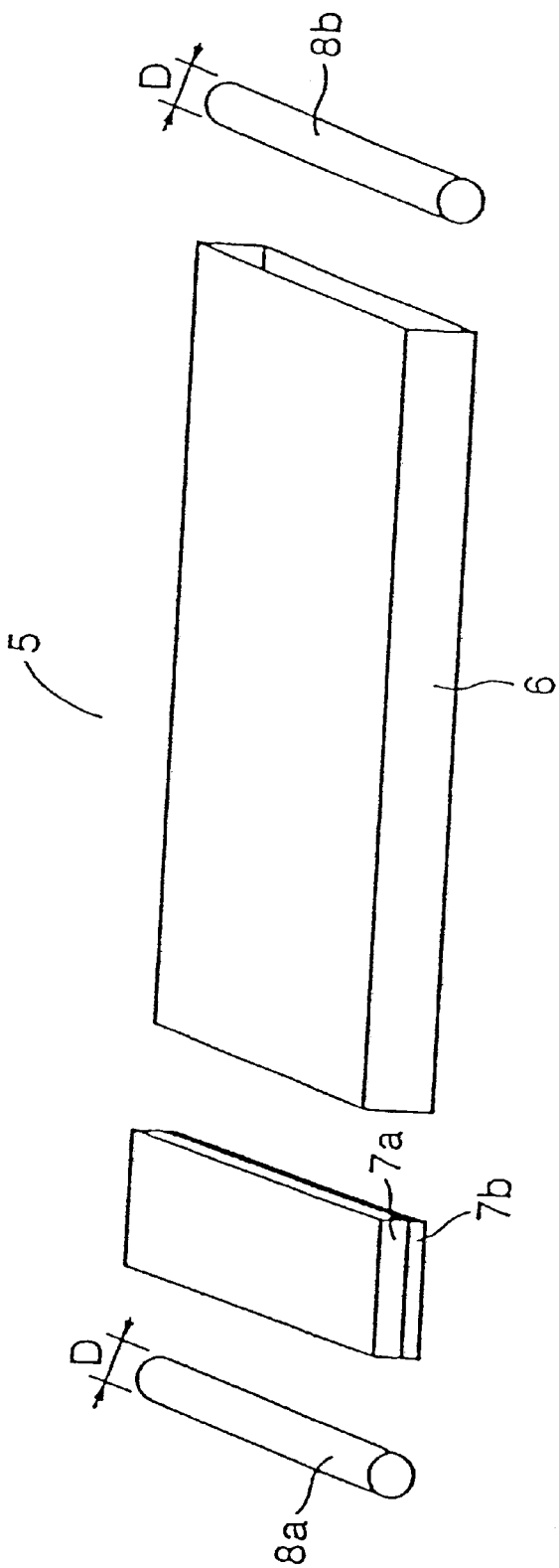
FIG. 2 is a schematic view of an insulating layer baking apparatus.

After that, the wire is subjected to heat treatment as a sintering process, thereby obtaining an oxide superconducting wire. Then, a coating process is carried out to form the insulating layer 4 in the oxide superconducting wire. In the coating process for forming the insulating layer 4, an insulating layer baking apparatus shown in FIG. 2 is used. FIG. 2 is a schematic view of the insulating layer baking apparatus.

Figure 3:
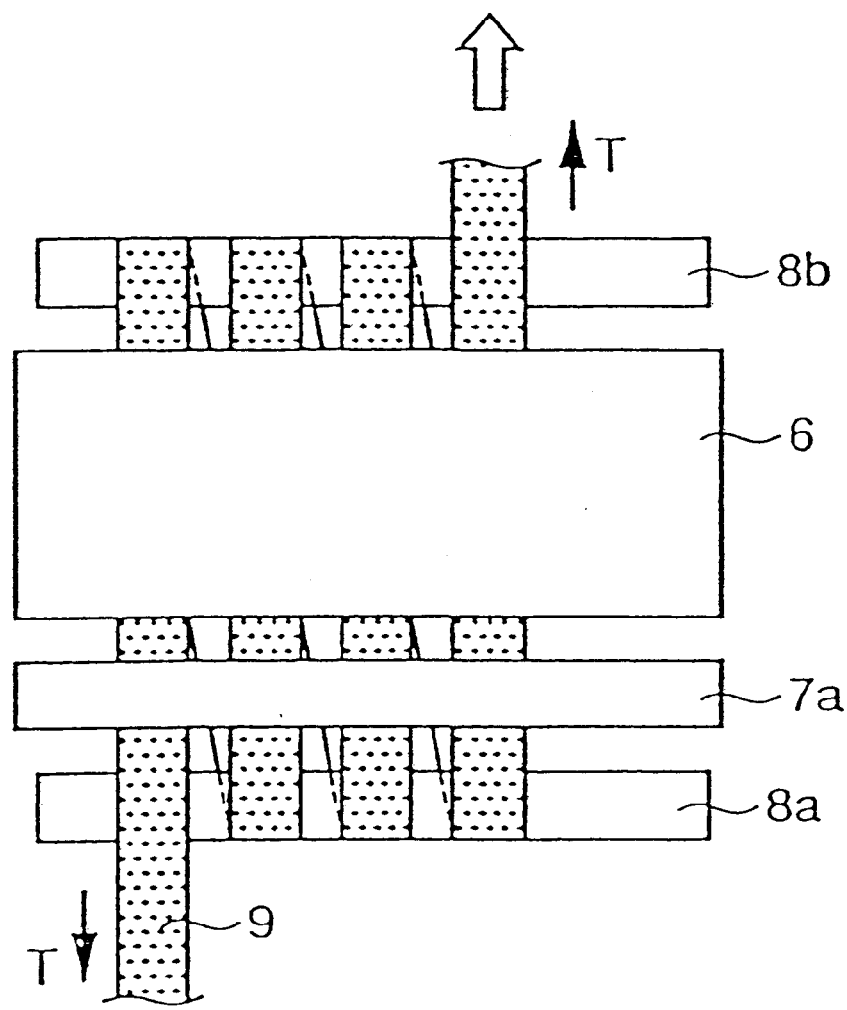
FIG. 3 is a schematic view of a baking process of an insulating layer.

Referring to FIG. 2, an insulating layer baking apparatus 5 comprises capstans 8a and 8b, felts 7a and 7b for applying an insulating-film base, and a baking furnace 6. By using the insulating layer baking apparatus 5 shown in FIG. 2, an insulating layer 4 (see FIG. 1) is formed on an oxide superconducting wire, as shown in FIG. 3. FIG. 3 is a schematic view explaining the process for baking the insulating layer.

Referring to FIG. 3, a tape-shaped oxide superconducting wire 9 passes over the capstan 8a from the lower left side of FIG. 3 and passes between the felts 7a and 7b impregnated with an insulating-film base. In this case, the felts 7a and 7b are pressed against the front and back surfaces of the oxide superconducting wire 9, and the insulating-film base is thereby applied over the entire front and back surfaces of the oxide superconducting wire 9.

After that, the oxide superconducting wire 9 enters the interior of the baling furnace 6 and is subjected to heating treatment in the baking furnace 6. An insulating layer is baked by the heat treatment.

The oxide superconducting wire 9 passed through the baking furnace 6 is wound on the capstan 8b so that the traveling direction thereof is changed nearly 180°. The oxide superconducting wire 9 passes beneath the baking furnace 6 and the felts 7a and 7b, is wound on the capstan 8a again so as to change its traveling direction again, and passes again through the felts 7a and 7b and the baking furnace 6. The operation of applying the insulating-film base and the operation of baking the insulating layer are repeated in this manner.

During the insulating layer baking process shown in FIG. 3, the insulating-film base applying and the baking are repeated four times. The oxide superconducting wire 9, which has been subjected to the insulating-film base applying and the baking repeated four times, is drawn out toward the upper right side of the figure, as shown by an empty arrow.

Tension T is applied to the oxide superconducting wire 9 in the longitudinal direction. Preferably, such tension T to be applied to the oxide superconducting wire 9 is less than 100 MPa at room temperature. Preferably, the tension T to be applied to the oxide superconducting wire 9 in a high-temperature atmosphere, as in the baking furnace 6, is less than 20 MPa. Preferably, the bending strain, which is defined as the ratio of the thickness of the oxide superconducting wire 9 to a diameter D of the capstans 8a and 8b (double the radius of curvature when bending the oxide superconducting wire 9)(see FIG. 2), is less than 0.2%.

During such an insulating layer baking process in the production procedure for the oxide superconducting wire, excessive mechanical strain is prevented from occurring in the oxide superconducting wire 9 by specifying the tension T to be applied to the oxide superconducting wire 9 and the bending strain. As a result, the superconducting properties of the oxide superconducting wire 9 are prevented from deteriorating even after the insulating layer baking process. In short, it is possible to prevent the decrease of the critical current density of the oxide superconducting wire 9 due to the insulating layer baking process.

Figure 4:
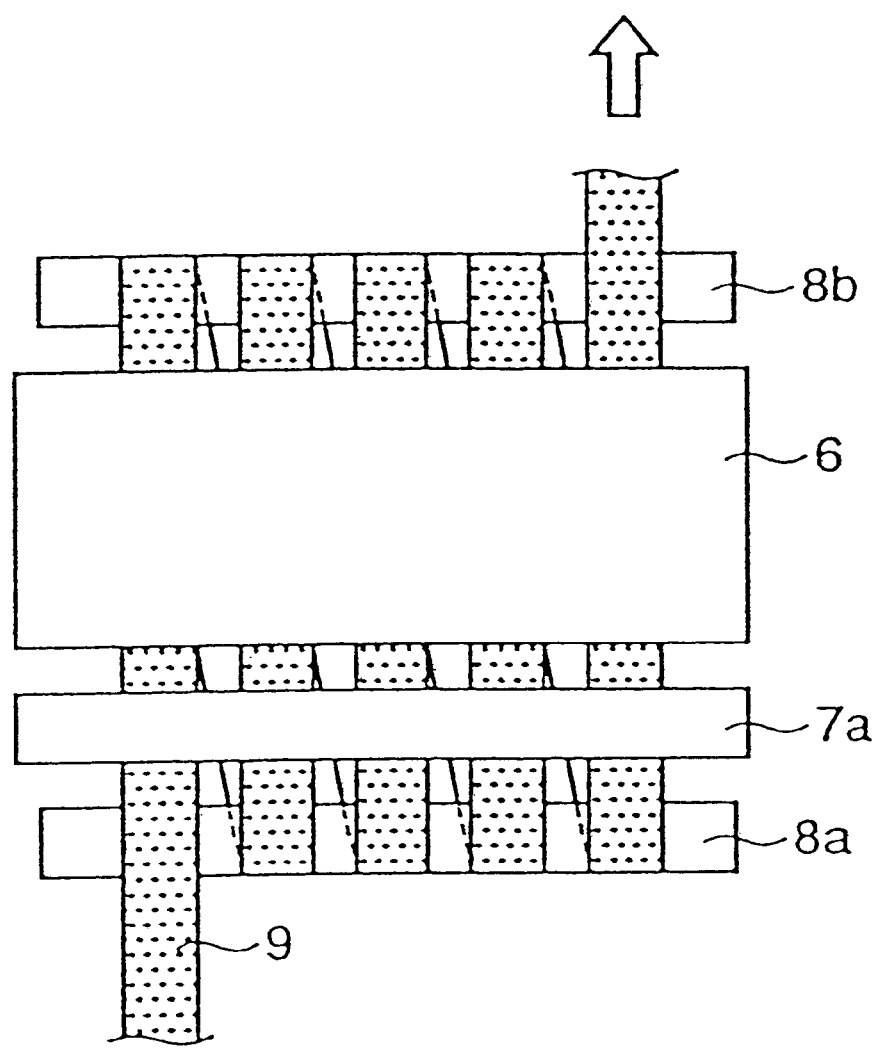
FIG. 4 is a schematic view of a modification of the insulating layer baking process shown in FIG. 3.

In the description of the insulating layer baking process shown in FIG. 3, the insulating-film base applying and the baking are repeated four times. However, in the case in which the tension T to be applied to the oxide superconducting wire 9 and the bending strain are set to be within the above-described value ranges, even when the insulating-film base applying and the baking are repeated five times in the insulating layer coating process, as shown in FIG. 4, advantages similar to those in the insulating layer coating process shown in FIG. 3 can be obtained. FIG. 4 is a schematic view explaining a modification of the insulating layer coating process shown in FIG. 3.

EXAMPLE 1

In an example of the present invention, the present inventors produced an oxide superconducting wire, which comprises bismuth-based superconducting filaments 1 (see FIG. 1), a first covering layer 2 made of silver so as to serve as a matrix (See FIG. 1), and a second covering layer 3 made of a silver alloy having a manganese content of 0.5% by weight so as to serve as a covering layer (see FIG. 1), by the production method described in the embodiment of the present invention. The critical current of the oxide superconducting wire was 30 A. The thickness of the superconducting wire was 0.24 mm.

An insulating layer 4 (see FIG. 1) was formed by the insulating layer baking process shown in FIG. 3. More specifically, the insulating layer baking process shown in FIG. 3, in which an insulating-film base applying and a baking were repeated four times, was repeated twice. As a result, the thickness of the insulating layer 4 was 10 $\mu$m. In this insulating layer baking process, the tension T applied to the oxide superconducting wire 9 (see FIG. 3) was 20 MPa, and the diameter D of the capstans 8a and 8b was 90 mm. The bending strain, which is defined as the ratio of the thickness of the oxide superconducting wire to the diameter of the capstans 8a and 8b, was 0.27%. This bending strain is smaller than the critical bending strain obtained by the composition of the covering layers in the embodiment, as will be described later. The baking temperature in the baking furnace 6 was set to be within the range of 300° C. to 350° C., and a polyvinyl formal resin was used as the insulating layer 4.

After such an insulating layer baking process, the critical current density of the oxide superconducting wire was measured 30 A, which was not lower than that measured before the insulating layer baking process. The withstand voltage of the insulating layer 4 was 3 kV on the flat surface of the wire. As a result of a continuity check of the oxide superconducting wire, deterioration of the characteristics thereof were not found. In such a case in which the first covering layer 2 does not contain antimony, it is preferable that the second covering layer have a manganese content ranging from 0.1% to 0.5% by weight.

Even when the first covering layer 2 does not contain antimony, the above manganese content allows manganese to be reliably prevented from diffusing and entering the superconducting filaments 1. This can reliably prevent the superconducting properties of the oxide superconducting wire from being deteriorated.

While the diameter D of the capstans 8a and 8b has been set at 90 mm, it may be set at a larger value. Since the bending strain of the oxide superconducting wire 9 can be decreased by increasing the diameter D of the capstans 8a and 8b, deterioration of the superconducting properties can be more reliably prevented.

By setting the tension to be applied to the oxide superconducting wire 9 at 20 MPa or less, the occurrence of excessive mechanical strain is prevented in the superconducting filaments 1 of the oxide superconducting wire 9 even in a high-temperature environment, for example, during baking in the baking furnace 6. As a result, it is possible to prevent deterioration of the superconducting properties of the oxide superconducting wire.

When the insulating-film base applying and the baking are repeated four times in one process, as in the example, the tension T to be applied to the oxide superconducting wire 9 can be easily reduced.

As a comparative example, a tape-shaped oxide superconducting wire was prepared which included bismuth-based oxide superconducting filaments and a covering layer made of silver. The critical current of the oxide superconducting wire was 30 A The thickness of the oxide superconducting wire was 0.24 mm, which is the same as that of the oxide superconducting wire of the above embodiment.

The oxide superconducting wire was subjected to an insulating layer baking process similar to that in the oxide superconducting wire production method according to the example of the present invention. More specifically, the insulating layer baking process shown in FIG. 3, in which an insulating-film base applying and a baking were repeated four times, was conducted twice. In this case, the tension applied to the oxide superconducting wire was 20 MPa, and the diameter D of the capstans 8a and 8b was 90 mm. The bending strain was 0.27%. The baking temperature in the baking furnace 6 was set to be within the range of 300° C. to 350° C., and a polyvinyl formal resin was used as an insulating layer 4.

As a result, an insulating layer 10 μm in thickness could be formed. After the insulating layer was formed, however, the critical current of the oxide superconducting wire measured 3 A, which is lower than 30 A measured before the formation of the insulating layer.

In another comparative example, an oxide superconducting wire was prepared which comprised superconducting filaments 1 made of a bismuth-based oxide superconductor (see FIG. 1), a first covering layer 2 made of a silver alloy having an antimony content of 0.5% by weight (see FIG. 1), and a second covering layer 3 made of a silver alloy having a manganese content of 1.0% by weight. The critical current of the oxide superconducting wire was 20 A. The thickness of the oxide superconducting wire was 0.24 mm.

The oxide superconducting wire was subjected to an insulating layer baking process in which an insulating-film base applying and a baking were repeated eight times. In this case, the diameter of the capstans 8a and 8b of the insulating layer baking apparatus was 90 mm. The bending strain was 0.27%. The tension applied to the oxide superconducting wire was 90 MPa, and the baking temperature in the baking furnace was within the range of 300° C. to 350° C. A polyvinyl formal resin was used as the material of the insulating layer.

In this case, a high tension of 90 MPa is applied to the oxide superconducting wire even in the baking operation by the baking furnace. For this reason, the tension of 90 MPa to be applied to the oxide superconducting wire in a high-temperature environment is out of the tension range specified in the oxide superconducting wire production method of the present invention. As a result, after the insulating layer baking process, the critical current of the oxide superconducting wire measured 4 A, which is markedly lower than the critical current of 20 A measured before the insulating layer was formed.

In contrast to the comparative examples in which the critical current was decreased, the deterioration of the superconducting properties, such as the decrease in critical current, was not caused in the example of the present invention. That is, according to the present invention, any problems such as a decrease in critical current of the oxide superconducting wire will not arise even after the insulating layer baking process, as described above.

In the oxide superconducting wire of the present invention, the critical tensile stress (tension) and the critical bending strain, which do not decrease the critical current, in the insulating layer baking process, were measured while changing the manganese content (Mn concentration) of the second covering layer 3 (see FIG. 1). As data on the tensile stress, the tensile stresses at room temperature and at high temperature (300° C.) were measured. The measurement results are shown in FIG. 5.

Figure 5:
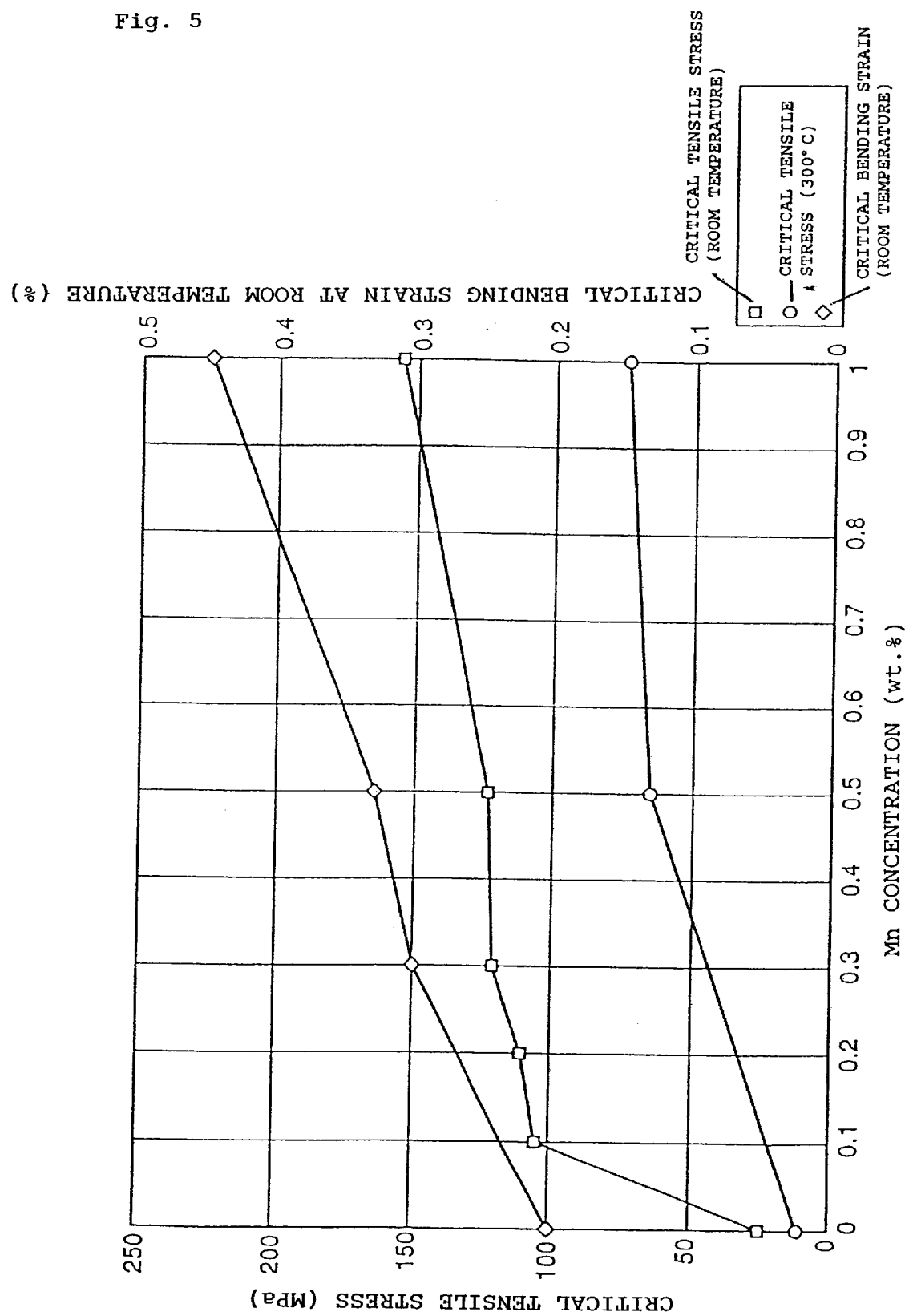
FIG. 5 is a graph showing the relationship among the Mn concentration, the critical tensile stress, and the critical bending strain in the second covering layer film of the oxide superconducting wire.

FIG. 5 is a graph showing the relationship among the Mn concentration of the second covering layer of the oxide superconducting wire, the critical tensile stress, and the critical bending strain. FIG. 5 shows that the critical tensile stress and the critical bending strain increase as the manganese concentration increases.

In the above example, the Mn concentration of the second covering layer is 0.5%, and the critical bending strain in this case is approximately 0.33%, as shown in FIG. 5. On the other hand, the bending strain in the example is 0.27%, as described above, and is smaller than the above-described critical bending strain. This also shows that the example of the present invention can prevent the superconducting properties from being deteriorated.

EXAMPLE 2

The present inventors produced samples which were different in material and in thickness of the second covering layer 3 serving as a covering layer, as shown in Table 1.

TABLE 1

| | Example | Comparative Example 1 | Comparative Example 2 | Comparative Example 3 |
|---|---|---|---|---|
| Superconductor Material | Bi-2223 Phase | Bi-2223 Phase | Bi-2223 Phase | Bi-2223 Phase |
| Number of Filaments | 61 | 61 | 61 | 61 |
| Material of Matrix (First Covering Layer) | Ag | Ag | Ag | Ag |
| Material of Covering Layer (Second Covering Layer) | Ag-0.3 wt % Mn | Ag-0.3 wt % Mn | Ag | Ag |
| Wire Length | 3.8 mm | 3.8 mm | 3.8 mm | 3.8 mm |
| Wire Breadth | 0.24 mm | 0.24 mm | 0.24 mm | 0.24 mm |
| Thickness of Covering Layer (Second Covering Layer) | 40 μm | 55 μm | 40 μm | 55 μm |
| Critical Current (77K, Self-Magnetic Field) | 60 A | 50 A | 60 A | 50 A |
| Number of Bulges After Sintering | 0 | 100 or more | 0 | 20 |
| Number of Bulges After Soaking in Liquid Nitrogen for About 2 min. and Passage of Current of about 70 A | 0 | 100 or more | 50 | 20 |

Referring to Table 1, a powder-in-tube method, which has been described in the embodiment of the present invention, was basically used as a production method for oxide superconducting wires of an example of the present invention and of Comparative Examples 1 to 3. More specifically, mixed powder was prepared by mixing $Bi_2O_3$, PbO, $SrCO_3$, $CaCO_3$, and CuO so that the composition ratio (atomic ratio) of Bi:Pb:Sr:Ca:Cu is 1.8:0.4:2:2:3. The mixed powder was subjected to heat treatment at 700° C. to 850° C. and pulverization several times, thereby yielding powder of precursor. The powder of precursor was filled in a first silver pipe serving as a first pipelike member so as to become a first covering layer 2. Subsequently, the first silver pipe filled with the powder of precursor was narrowed by wire drawing. After that, the narrowed first silver pipe was cut to an appropriate length. A predetermined number (sixty-one) of first silver pipes thus cut were bundled and were inserted into a second pipe made of silver or a silver manganese alloy serving as a second pipelike member so as to become a second covering layer 3 which has a composition shown in Table 1. Then, the second silver pipe or silver manganese alloy pipe was fine-gauged by wire drawing, thereby yielding a multi-core wire having a diameter of 1.29 mm. The multi-core wire was rolled into a tape-shaped wire of a rectangular cross section. The length of the tape-shaped wire was 3.8 mm and the breadth (the thickness of a flat portion of the tape-shaped wire) was 0.24 mm. After that, the tape-shaped wire was subjected to sintering at 845° C. for fifty hours. An oxide superconducting wire was formed from the powder of precursor by the sintering operation. In this way, samples of Example and Comparative Examples 1 to 3 were yielded. The length of the samples was approximately 1 km. The samples were respectively subjected to examination for bulge occurring after sintering, measurement of the critical current, and examination of the state of bulge after the samples were soaked in liquid nitrogen and current is passed therethrough. The results thereof are shown in Table 1.

As is evident from Table 1, bulges occurred after sintering in Comparative Examples 1 and 3. This is because gas, which is produced with a reaction that generates an oxide superconductor during the sintering process, cannot sufficiently pass through the thick second covering layer 3 of 55 m thickness in Comparative Examples 1 and 3.

In Comparative Example 2, bulge did not occur after sintering. This seems to be because the thickness of 40 μm of the covering layer is thin enough to allow passage of the above-described gas, in a manner similar to that in the Example. However, after the sample of Comparative Example 2 was soaked in liquid nitrogen for about 2 minutes and a current of approximately 70 A at maximum was passed therethrough, many bulges were produced. It can be thought that the bulges were produced for the following reasons. That is, liquid nitrogen enters the interior of the wire when the wire is soaked therein. The entering liquid nitrogen is vaporized by Joule's heat generated by the passage of current. The silver covering layer, which has a relatively lower strength compared to that of the Example, is pushed outside by the nitrogen vaporized inside the wire. In this way, many bulges are produced in Comparative Example 2.

Figure 6:
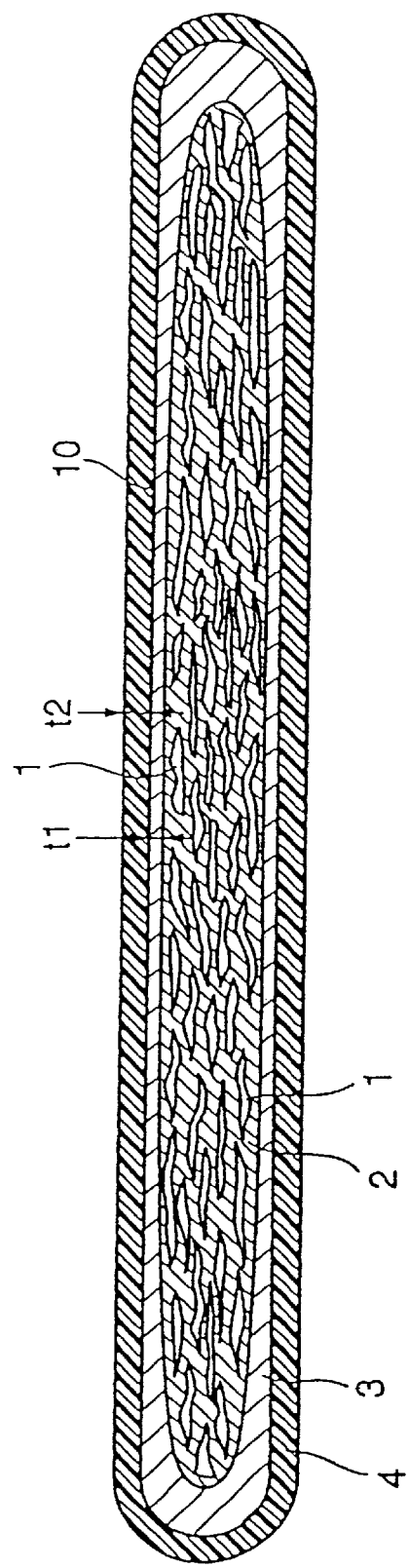
FIG. 6 is a schematic sectional view of the oxide superconducting wire according to an example of the present invention.

The wire of the Example was provided with an insulating layer 4 made of a polyvinyl formal resin by using the method described in the embodiment of the present invention. FIG. 6 is a schematic sectional view of an oxide superconducting wire having the insulating layer 4 according to Example 2 of the present invention. Referring to FIG. 6, the thickness t1 of a second covering layer 3 at a flat portion of the sample is 40 μm, as shown in Table 1. Since the flat portion constitutes a large proportion of the surface of the tape-shaped oxide superconducting wire, when the thickness of the second covering layer 3 at the flat portion is within the range of 10 μm to 50 μm, the above-described advantages of the oxide superconducting wire of the present invention can be provided more reliably.

Samples having insulating layers 4 having different thickness t2 were prepared. The dielectric breakdown AC voltages of the insulating layers 4 of the samples were measured by a foil method. Some of the samples whose insulating layers 4 have thickness of less than 5 μm were conducting at the time of measurement. The samples having an insulating layer 4 of 14 μm in thickness showed a dielectric breakdown voltage of an average of 1100 V to 1350 V.

EXAMPLE 3

Figure 7:
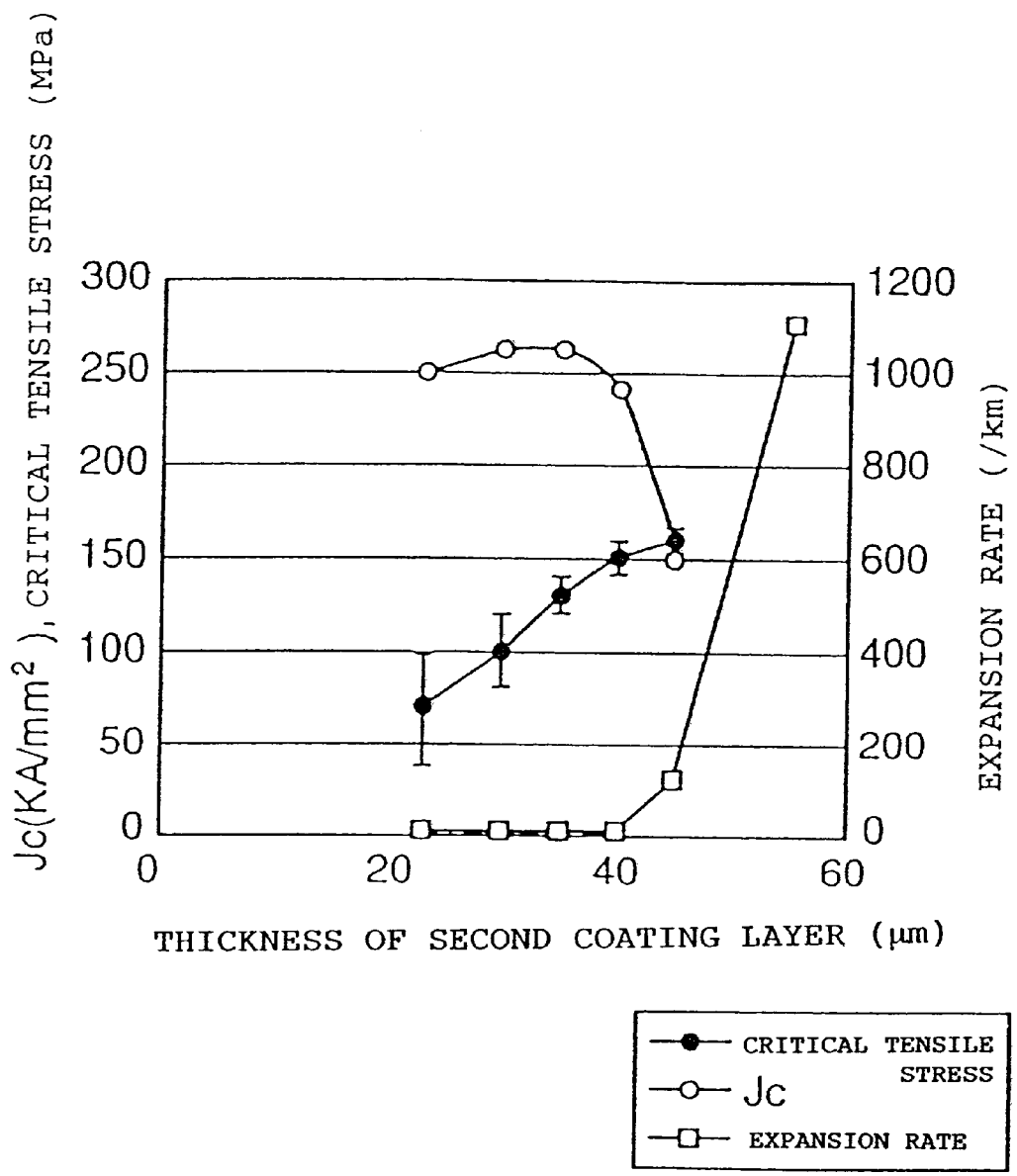
FIG. 7 is a graph showing the relationship among the thickness of the second covering layer, the critical tensile stress, the critical current density, and the bulge occurring rate in a sintering process for producing an oxide superconductor.

In a production procedure similar to that of Example 2, samples of oxide superconducting wires, which included second covering layers 3 having different thickness, were produced. The specifications of the samples are basically similar to those of the samples in Example 2 of the present invention (see Table 1) except for the thickness of the second covering layers 3. Measurements were taken of the critical tensile stress that does not decrease the critical current, the critical current density (Jc), and the bulge occurring rate during a sintering process for producing an oxide superconductor of each sample. The results of the measurements are shown in FIG. 7. FIG. 7 is a graph showing the relationship among the thickness of the second covering layer 3, the critical tensile stress, the critical current density, and the bulge occurring rate during a sintering process for producing an oxide superconductor.

FIG. 7 shows that many bulges are produced in the sintering process when the thickness of the second covering layer 3 exceeds 50 μm. When the second covering layer 3 had a thickness less than 10 μm, they were cracked in a sample production process. It is also shown that, when the thickness t1 of the flat portion of the second covering layer 3 is within the range of 20 μm to 40 μm, few bulges are produced in the sintering process, a high critical current density can be maintained, and a sufficient critical tensile stress is obtained.

Referring to FIG. 6, the shortest distance between a surface 10 of the second covering layer 3 to an oxide superconducting filament 1 was approximately used as the thickness of the second covering layer 2 in the measurements.

It is to be understood that the embodiment and the examples disclosed above are given as examples in all respects and that they are not limiting. It is intended that the scope of the invention be not as specified by the above-described embodiment and examples, but as specified by the claims, and that the invention covers equivalent arrangements and all modifications included within the scope of the claims.

Industrial Applicability

In this way, according to the present invention, it is possible to provide an oxide superconducting wire which has a sufficient mechanical strength and allows an insulating layer to be formed therein without deteriorating the superconducting properties.

What is claimed is:

1. An oxide superconducting wire production method comprising:

a step of preparing a wire having powder of precursor to be sintered into an oxide superconductor, a matrix placed so as to enclose said powder of precursor and made of silver, and a covering layer placed so as to enclose said matrix and containing silver and 0.1% to 0.5% manganese by weight;

a sintering step of forming an oxide superconductor from said powder of precursor by heating said wire; and a coating step of forming an insulating layer on the outer surface of said covering layer so as to enclose said covering layer in a state in which tension is applied in the longitudinal direction to said wire having said oxide superconductor.

2. An oxide superconducting wire production method according to claim 1, wherein said preparation step comprises:

a step of filing said powder of precursor in a first pipelike member to become said matrix;

a step of drawing said first pipelike member filled with said powder of precursor;

a step of placing said narrowed first pipelike member inside a second pipelike member to become said covering layer; and a step of drawing said second pipelike member with said narrowed first pipelike member placed therein.

3. An oxide superconducting wire production method according to claim 1, wherein the thickness of said covering layer after said preparation step is within the range of 10 $\mu$m to 50 $\mu$m.

4. An oxide superconducting wire production method according to claim 3; wherein the thickness of said covering layer after said preparation step is within the range of 20 $\mu$m to 40 $\mu$m.

5. An oxide superconducting wire production method according to claim 2, wherein said preparation step further comprises shaping said wire like a tape having a flat portion.

6. An oxide superconducting wire production method according to claim 5, wherein after said shaping step the thickness of said covering layer at said flat portion is within the range of 10 $\mu$m to 50 $\mu$m.

7. An oxide superconducting wire production method according to claim 6, wherein after said shaping step the thickness of said covering layer at said flat portion is within the range of 20 $\mu$m to 40 $\mu$m.

8. An oxide superconducting wire production method according to claim 1, wherein the thickness of said insulating layer in said coating step is within the range of 5 $\mu$m to 100 $\mu$m.

9. An oxide superconducting wire production method according to claim 1, wherein said insulating layer contains resin.

10. An oxide superconducting wire production method according to claim 9, wherein said resin is a formal resin.

11. An oxide superconducting wire production method according to claim 1, wherein said oxide superconductor is a bismuth-based oxide superconductor.

12. An oxide superconducting wire production method according to claim 2, wherein the thickness of said covering layer after said preparation step is within the range of 10 $\mu$m to 50 $\mu$m.

13. An oxide superconducting wire production method according to claim 4, wherein said preparation step further comprises shaping said wire like a tape having a flat portion.

14. An oxide superconducting wire production method according to claim 7, wherein the thickness of said insulating layer in said coating step is within the range of 5 $\mu$m to 100 $\mu$m.

15. An oxide superconducting wire production method according to claim 8, wherein said insulating layer contains resin.

16. An oxide superconducting wire production method according to claim 10, wherein said oxide superconductor us a bismuth-based oxide superconductor.

17. A process for forming an insulating layer on a superconducting wire, comprising:

applying tension to the superconducting wire in a longitudinal direction; and forming the insulating layer on an outer surface of the superconducting wire so as to enclose the superconducting wire with the insulating layer while applying the tension to the superconducting wire.

18. The process according to claim 17, further comprising the step of:

heating the superconducting wire while forming the insulating layer.

19. The process according to claim 18, wherein the applied tension is less than 20 Mpa.

20. The process according to claim 17, wherein the superconducting wire is shaped like a tape having a flat portion.

21. The process according to claim 20, wherein the thickness of the formed insulating layer is within the range of 5$\mu$m to 100 $\mu$m.

22. The process according to claim 17, wherein the insulating layer comprises resin.

23. The process according to claim 17, wherein the superconducting wire comprises a bismuth-based oxide superconductor.

* * * * *